(12) United States Patent
Joo

(10) Patent No.: US 7,116,588 B2
(45) Date of Patent: Oct. 3, 2006

(54) LOW SUPPLY VOLTAGE TEMPERATURE COMPENSATED REFERENCE VOLTAGE GENERATOR AND METHOD

(75) Inventor: Yangsung Joo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 108 days.

(21) Appl. No.: 10/932,480

(22) Filed: Sep. 1, 2004

(65) Prior Publication Data
US 2006/0044883 A1 Mar. 2, 2006

(51) Int. Cl.
*G11C 7/00* (2006.01)

(52) U.S. Cl. .................... 365/189.09; 365/189.11; 361/24; 327/83; 327/138; 327/355; 327/361; 327/378

(58) Field of Classification Search ............ 365/189.09
See application file for complete search history.

(56) References Cited

U.S. PATENT DOCUMENTS

| | | | | |
|---|---|---|---|---|
| 3,995,810 A * | 12/1976 | Banks | ............... | 237/8 R |
| 5,260,643 A | 11/1993 | Sandhu | ............... | 323/225 |
| 5,319,370 A | 6/1994 | Signore et al. | ............... | 341/120 |
| 5,367,249 A | 11/1994 | Honnigford | ............... | 323/313 |
| 5,412,448 A | 5/1995 | Kunishige | ............... | 354/400 |
| 5,440,305 A | 8/1995 | Signore et al. | ............... | 341/120 |
| 5,532,578 A | 7/1996 | Lee | ............... | 323/313 |
| 5,563,502 A | 10/1996 | Akioka et al. | ............... | 323/313 |
| 5,781,043 A | 7/1998 | Slemmer | ............... | 327/78 |
| 5,852,360 A | 12/1998 | Levinson | ............... | 323/316 |
| 5,955,874 A | 9/1999 | Zhou et al. | ............... | 323/315 |
| 5,961,215 A | 10/1999 | Lee et al. | ............... | 374/178 |
| 6,055,489 A | 4/2000 | Beatty et al. | ............... | 702/130 |
| 6,097,179 A | 8/2000 | Ray et al. | ............... | 323/312 |
| 6,111,397 A | 8/2000 | Leung | ............... | 323/315 |
| 6,121,848 A * | 9/2000 | Sauer | ............... | 331/108 C |
| 6,157,244 A | 12/2000 | Lee et al. | ............... | 327/539 |
| 6,184,670 B1 * | 2/2001 | Mulatti et al. | ............... | 323/314 |
| 6,201,436 B1 | 3/2001 | Hur et al. | ............... | 327/543 |
| 6,218,822 B1 | 4/2001 | MacQuigg | ............... | 323/313 |
| 6,263,764 B1 | 7/2001 | Steinbock | ............... | 81/57.38 |
| 6,281,760 B1 | 8/2001 | Koelling et al. | ............... | 331/66 |
| 6,344,762 B1 * | 2/2002 | Prentice | ............... | 327/65 |
| 6,384,670 B1 | 5/2002 | Eagar et al. | ............... | 327/539 |
| 6,424,276 B1 * | 7/2002 | Munoz et al. | ............... | 341/120 |
| 6,448,844 B1 | 9/2002 | Cho | ............... | 327/538 |
| 6,486,806 B1 * | 11/2002 | Munoz et al. | ............... | 341/120 |
| 6,507,179 B1 | 1/2003 | Jun et al. | ............... | 323/313 |
| 6,528,979 B1 | 3/2003 | Kimura | ............... | 323/313 |
| 6,560,152 B1 * | 5/2003 | Cernea | ............... | 365/211 |
| 6,628,558 B1 | 9/2003 | Fiscus | ............... | 365/222 |
| 6,642,776 B1 | 11/2003 | Micheloni et al. | ............... | 327/539 |
| 6,768,139 B1 | 7/2004 | Fischer et al. | ............... | 257/185 |
| 6,788,041 B1 | 9/2004 | Gheorghe et al. | ............... | 323/313 |
| 6,828,689 B1 | 12/2004 | Madurawe | ............... | 257/903 |

(Continued)

*Primary Examiner*—Huan Hoang
*Assistant Examiner*—Ly Duy Pham
(74) *Attorney, Agent, or Firm*—Dorsey & Whitney, LLP

(57) ABSTRACT

A reference voltage generator uses a conventional forward junction voltage generating device and a conventional thermal generator to generate a thermal voltage. The forward junction voltage and the thermal voltages have respective thermal sensitivities that act oppositely to each other so that, when the forward junction voltage is combined with the thermal voltage to produce a reference voltage, the reference voltage is substantially insensitive to temperature. The forward junction voltage and the thermal voltage are combined to produce the reference voltage in a manner that avoids generating any voltage having a magnitude that is greater than the magnitude of the sum of the forward voltage and the thermal voltage.

57 Claims, 8 Drawing Sheets

U.S. PATENT DOCUMENTS 6,901,022 B1 * 5/2005 Fiscus ........................ 365/222
2003/0151956 A1 * 8/2003 Marr et al. ............ 365/189.09
2004/0000894 A1 * 1/2004 Zhang ........................ 323/225
2005/0024951 A1 * 2/2005 Marotta et al. ........ 365/189.09

* cited by examiner

US 7,116,588 B2

LOW SUPPLY VOLTAGE TEMPERATURE COMPENSATED REFERENCE VOLTAGE GENERATOR AND METHOD

TECHNICAL FIELD

This invention relates to voltage reference circuits, and, more particularly, to a temperature compensated diode voltage circuit that can generate a temperature compensated voltage using a relatively low supply voltage.

BACKGROUND OF THE INVENTION

A variety of electronic devices and circuits must be supplied with a voltage having a magnitude that is precisely controlled using a voltage regulator, charge pump or other voltage source. The magnitude of the voltage supplied by the voltage regulator, charge pump or other source is often set by the magnitude of a reference voltage. Various reference voltage generators are well known in the art.

A common reference voltage generator is a diode voltage generator, a typical example of which is shown in FIG. 1. The diode voltage generator 10 includes a reference current source 14 directing a reference current $I_R$ through a bipolar PNP transistor 20 having its base and collector interconnected in a diode configuration. A PN junction diode forward voltage $V_{EB}$ is produced at the emitter of the transistor 20. Of course, other designs for a diode voltage generator can be used, such as one having a bipolar NPN transistor.

The current-voltage characteristics of the diode voltage generator 10 are shown in FIG. 2. As shown in FIG. 2, as the current flowing through the transistor 20 increases from zero, the emitter-base voltage $V_{EB}$ increases quite dramatically until the "knee" 22 of the curve is reached. Thereafter as the current increases further, the emitter-base voltage $V_{EB}$ is fairly constant despite large changes in the magnitude of the current. The current source 14 maintains the reference current $I_R$ at a magnitude that is greater than the magnitude of the current at the knee 22. As a result, the diode reference voltage $V_{EB}$ is maintained at a relatively constant value despite slight fluctuations in the magnitude of the reference current $I_R$. A typical value for the diode reference voltage $V_{BG}$ is 0.65 volts, and the diode voltage generator 10 is able to maintain that voltage to within a few millivolts.

Diode voltage generators are often exposed to environments in which the temperature can vary widely, and yet it is important to maintain the reference voltage constant despite these temperature variations. Unfortunately, although the diode reference voltage $V_{EB}$ is substantially insensitive to small variations in the magnitude of the reference current $I_R$, the voltage $V_{EB}$ is not insensitive to variations in the temperature of the transistor 20. In particular, the magnitude of the diode reference voltage $V_{EB}$ varies with temperature at about $-2$ mV/° C., as shown in the graph of FIG. 3. Circuits have therefore been developed to temperature compensate the diode reference voltage $V_{EB}$ shown in FIG. 1. An example of a temperature compensated diode voltage generator 30 is shown in FIG. 4. The reference voltage generator 30 uses a summing amplifier 34 to sum $V_{EB}$ from the PN junction diode of FIG. 1 with a thermal reference voltage $V_T$ generated by a thermal voltage source 36 to produce a reference voltage $V_R$ at its output. The thermal reference voltage $V_T$ is generated from a voltage generated by the thermal voltage source 36 after being boosted by a factor of K using an amplifier 38 having a gain of K.

The thermal reference voltage $V_T$ is 0.026V varying with temperature at 0.085 mV/° C. After this value is adjusted by a constant K to make the thermal voltage equal to 0.6 V, a temperature sensitivity of 1.96 mV/° C. is obtained (i.e., K=0.06 V/0.026 V). The sum of the 1.96 mV/° C. thermal sensitivity of the thermal reference voltage $V_T$ and the $-2$ mV/° C. thermal sensitivity of the diode forward voltage $V_{EB}$ results in a terminal sensitivity of the reference voltage $V_R$ of only about $-0.04$ mV/° C., which is substantially insensitive to temperature variations. A graph of the reference voltage $V_R$, i.e., the sum of the thermal reference voltage $V_T$ and the diode forward voltage $V_{EB}$, is shown in FIG. 6.

Although the temperature compensated diode voltage generator 30 can provide a precise reference voltage that is substantially insensitive to temperature, it is not without its limitations. In particular, as is apparent from FIG. 6, the diode voltage generator 30 generates a reference voltage $V_R$ of about 1.25 volts, which inherently requires a supply voltage of at least 1.25 volts. However, electronic devices are increasingly being powered by supply voltages of less than 1.25 volts, thus making the temperature compensated diode voltage generator 30 unsuitable for use in such devices. As a result, there is no relatively simple and inexpensive means to provide a precise, temperature compensated reference voltage in low voltage devices.

There is therefore a need for a method and system for generating a precise reference voltage that is substantially insensitive to temperature and that can be powered by a relatively low supply voltage.

SUMMARY OF THE INVENTION

A reference voltage generator includes a diode voltage generator producing a diode forward $V_{EB}$ voltage, and a thermal voltage generator generating a thermal voltage. The diode forward voltage $V_{EB}$ has a magnitude that has a first predetermined temperature sensitivity. Similarly, the thermal voltage generated by the thermal voltage generator has a magnitude that has a second predetermined temperature sensitivity. A signal combiner receives the diode forward voltage from the diode voltage generator and the thermal voltage from the thermal voltage generator. The signal combiner combines the diode forward voltage with the thermal voltage to provide a reference voltage in a manner that causes the second temperature sensitivity to substantially counteract the first temperature sensitivity. As a result, the reference voltage is substantially insensitive to temperature. The signal combiner combines the diode forward voltage with the thermal voltage without generating any voltage having a magnitude that is substantially greater than either the diode forward voltage or the thermal voltage. As a result, the temperature compensated diode voltage generator is particularly suitable for low supply voltage applications.

DETAILED DESCRIPTION OF THE INVENTION

Figure 1:
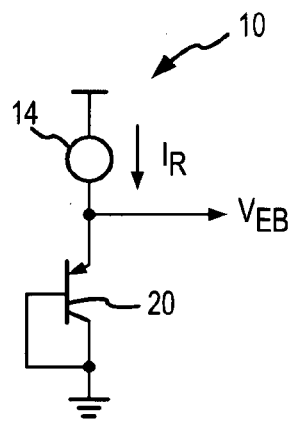
FIG. 1 is a schematic diagram of a conventional diode voltage generator.
Figure 2:
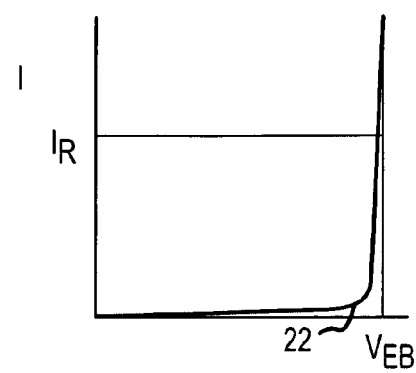
FIG. 2 is a graph showing the current-voltage characteristics of the diode voltage generator of FIG. 1.
Figure 3:
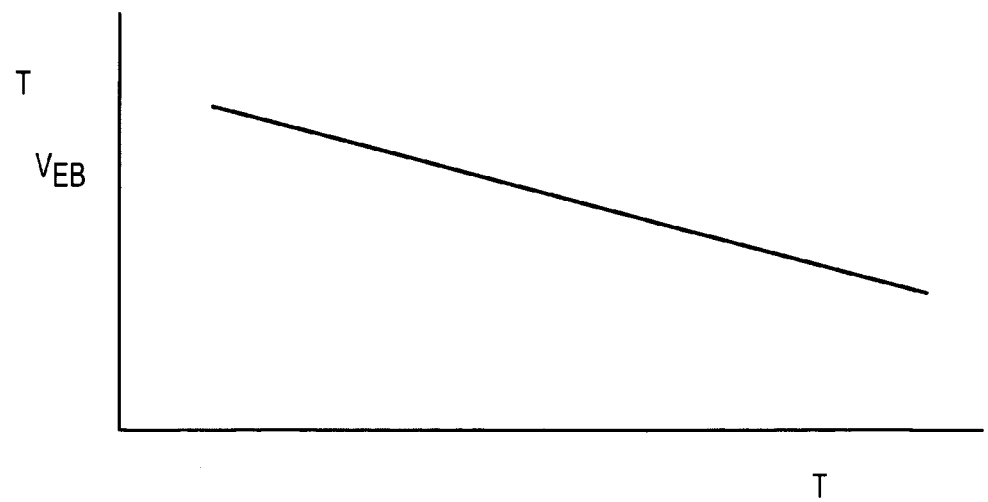
FIG. 3 is a graph showing the magnitude of the diode forward voltage generated by the diode voltage generator of FIG. 1 as a function of temperature.
Figure 4:
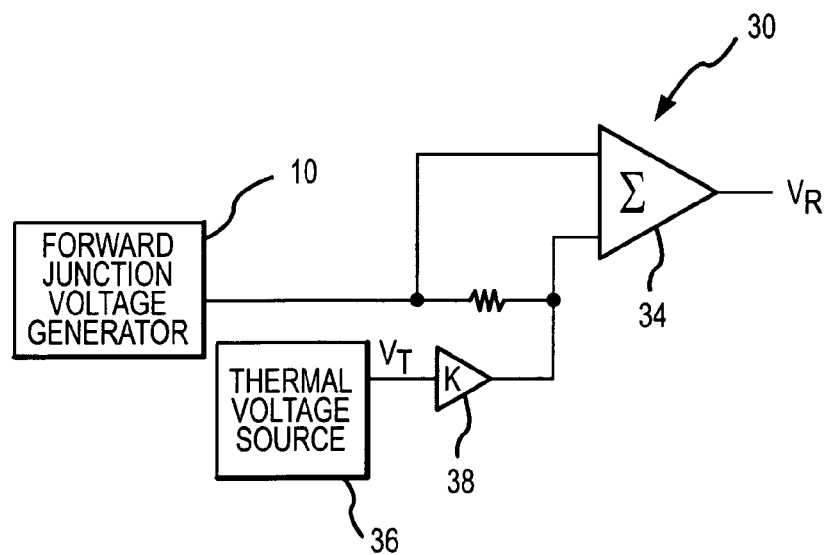
FIG. 4 is a block diagram of a conventional temperature compensated diode voltage generator.
Figure 5:
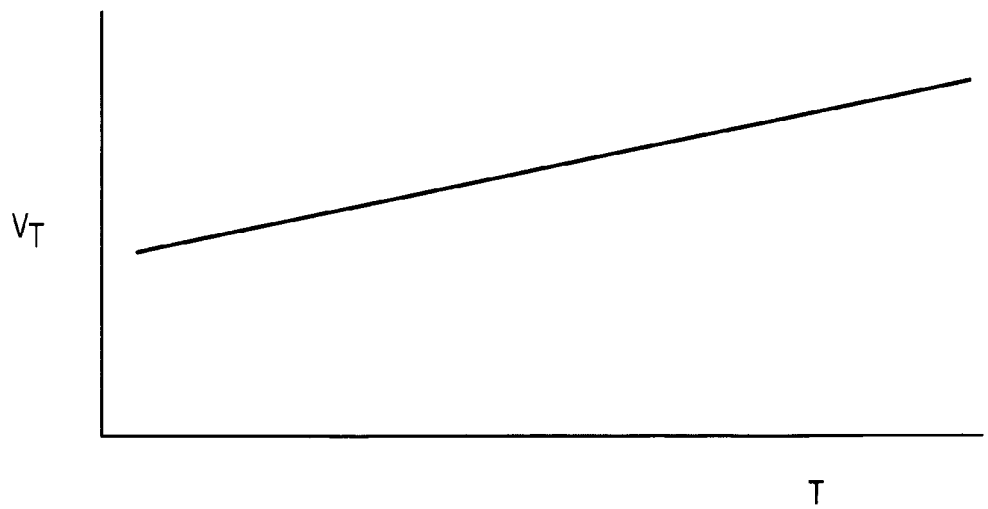
FIG. 5 is a graph showing the magnitude of a thermal reference voltage generated by a thermal voltage generator in the voltage generator of FIG. 4 as a function of temperature.
Figure 6:
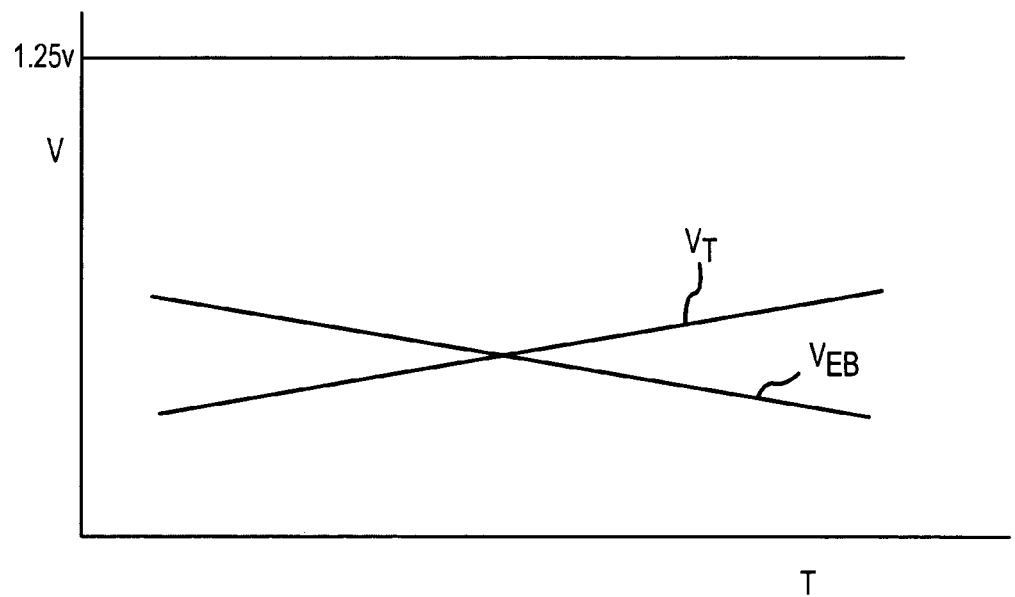
FIG. 6 is a graph showing the magnitude of the reference voltage generated by the temperature compensated diode voltage generator of FIG. 4 as a function of temperature.
Figure 7:
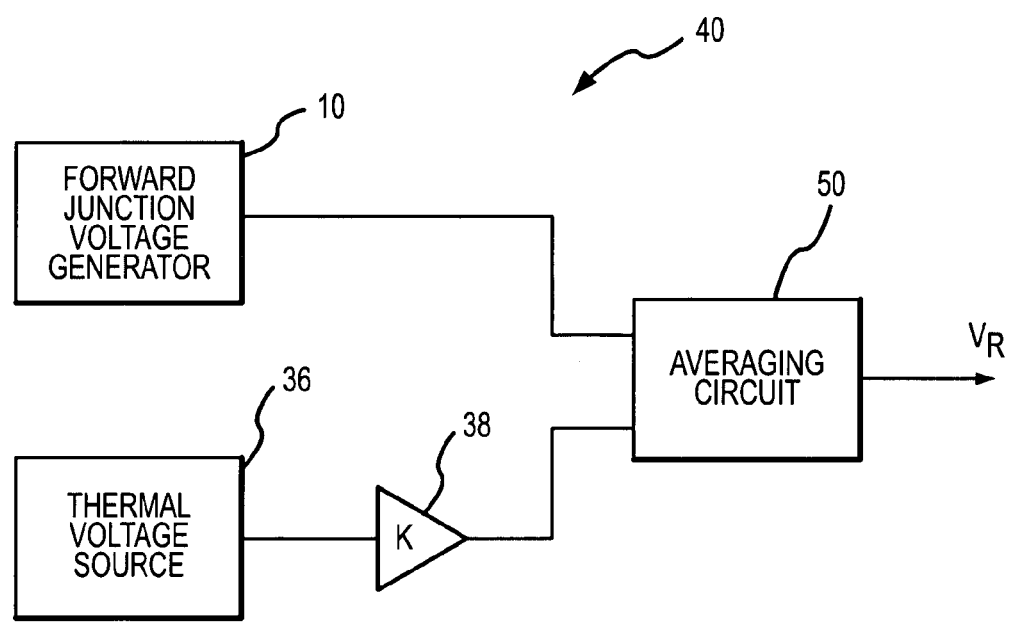
FIG. 7 is a block diagram of a low voltage, temperature compensated diode voltage generator according to one embodiment of the invention.

A low voltage, temperature compensated diodevoltage generator 40 according to one embodiment of the invention is shown in FIG. 7. The reference voltage generator 40 includes the diode voltage generator 10 of FIG. 1 or some other presently known or hereinafter developed diode voltage generator, which generates a diode forward voltage. The diode voltage generator 40 also includes the thermal voltage source 36, which may be any presently known or hereinafter developed thermal voltage generator. The thermal voltage source 36 generates a voltage $V_T$, which is amplified by a factor of K by the amplifier 38 to produce a thermal reference voltage of $KV_T$. The diode forward voltage $V_{EB}$ generated by the diode voltage generator 10 and the thermal reference voltage $KV_T$ generated by the thermal voltage source 36 and amplifier 38 are applied to an averaging circuit 50. As mentioned above, the average of these two voltages is obtained in the prior art by summing the voltages and dividing the summed voltage by two. However, the averaging circuit 50 works in a substantially different manner. Specifically, the averaging circuit 50 directly obtains the average of the two voltages $V_{BE}$ and $KV_T$ without simply summing the voltages. More specifically, the averaging circuit 50 preferably obtains the average of the two voltages $V_{BE}$ and $KV_T$ without generating any voltage that is significantly greater than either the diode forward voltage $V_{BE}$ or the thermal reference voltage $KV_T$. As a result, it is possible (but not necessary) to power the temperature compensated diode voltage generator 40 with a supply voltage having a magnitude that is substantially equal to the diode forward voltage $V_{EB}$. The temperature compensated diode voltage generator 40 is therefore ideally suited to low voltage applications, and, because of its low supply voltage capabilities, may even consume less power compared to prior art temperature compensated diode voltage generators.

Figure 8:
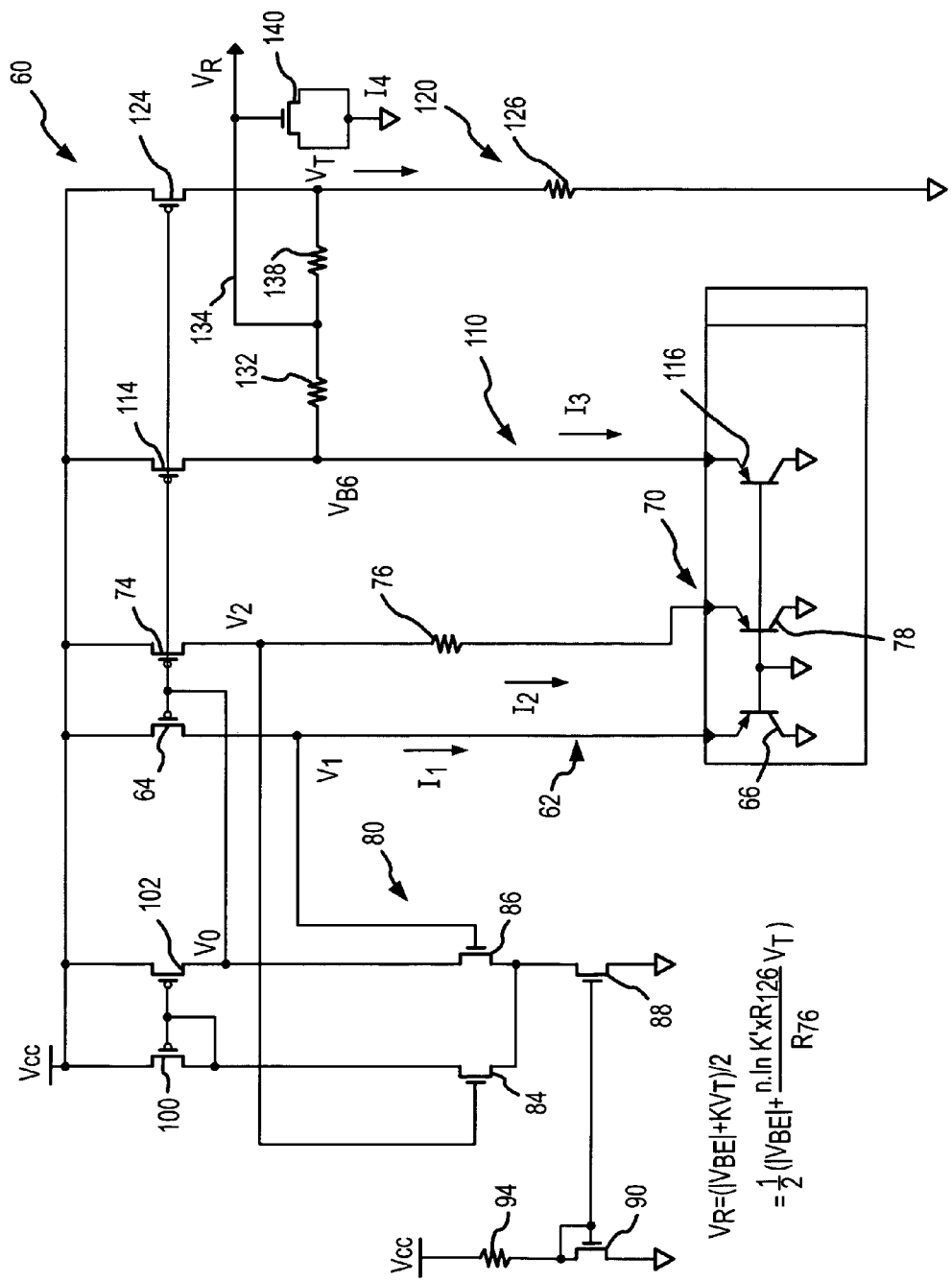
FIG. 8 is a schematic diagram of an embodiment of the low voltage, temperature compensated diode voltage generator of FIG. 7.

A more specific embodiment 60 of the temperature compensated diode reference voltage generator 40 is shown in FIG. 8. The temperature compensated diode voltage generator 60 includes a first current path 62 formed by a PMOS transistor 64 coupled in series with a diode-coupled PNP bipolar transistor 66 between a supply voltage $V_{CC}$ and ground. The transistors 64, 66 set the magnitude of a current $I_1$ through the current path 62 at a predetermined value.

A second current path 70 is formed by a PMOS transistor 74 coupled in series with a resistor 76 and another diode-coupled PNP bipolar transistor 78 between the supply voltage $V_{CC}$ and ground. A current of $I_2$ flows through the second current path 70.

A voltage $V_1$ generated at the junction between the transistors 64, 66 in the first current path 62 and a voltage $V_2$ generated at the transistor 74 and resistor 76 in the second current path 70 are coupled to respective inputs of a differential amplifier 80 formed by a pair of NMOS transistors 84, 86 in which the gates of the transistors 84, 86 serve as the inputs to the differential amplifier 80. The transistors 84, 86 have their sources connected to each other and to an NMOS current sink transistor 88. The gate of the transistor 88 receives a bias voltage from a diode coupled NMOS transistor 90, which is supplied with current through a resistor 94, thereby setting the current flowing through the transistor 88. The drains of the transistors 84, 86 are coupled to respective PMOS transistors 100, 102, which are connected in a current mirror to ensure that the currents through the transistors 84, 86 are equal to each other. An output voltage $V_O$ from the differential amplifier 80 is developed at the drain of the transistor 86, and it is coupled to the gate of the PMOS transistor 74 in the second current path 70 to control the flow of current through the second current path 70.

In operation, the differential amplifier 80 uses the voltage $V_1$ from the first current path 62 and the voltage $V_2$ from the second current path 70 to control the current $I_2$ through the second current path 70 so that it is equal to the current $I_1$ in the first current path 62. More specifically, if the current $I_1$ increases, the voltage $V_1$ will also increase. The resistance of the transistor 86 will then decrease because of the higher voltage applied to the gate of the transistor 86. As a result, the voltage $V_O$ will decrease because, as explained above, the current through the transistor 86 will remain equal to the current through the transistor 100 because of the current mirror configuration of the transistors 100, 102. The decreased output voltage $V_O$ turns ON the PMOS transistor 74 to a greater extent, thereby increasing the current $I_2$ so that it is now equal to the current $I_1$. Conversely, if the current $I_1$ decreases, the voltage $V_1$ will also decrease to increase the resistance of the transistor 86. As a result, the output voltage $V_O$ will increase, which will reduce the current $I_2$ so that it is equal to the current $I_1$.

In a similar manner, if the current $I_2$ increases, the voltage $V_2$ will also increase, thereby turning ON the transistor 84 to a greater extent. As a result, the current through the transistors 84, 100 will increase, and, because of the current mirror configuration of the transistors 100, 102, the current through the transistor 102 will also increase. As a result, the voltage $V_O$ will also increase, thereby decreasing the current $I_2$ flowing through the transistor 74. The current $I_2$ is thus decreased so that it is again equal to the current $I_1$. Conversely, if the current $I_2$ decreases, the voltage $V_2$ will also decrease, thereby decreasing the current flowing through the transistors 84, 100. The current flowing through the transistor 102 will then also decrease to decrease the voltage $V_O$, which will increase the current $I_2$ so that it is again equal to the current $I_1$. The current $I_1$ through the first current path 62 will therefore always be equal to the current $I_2$ flowing through the second current path 70.

It should also be noted that the magnitude of the supply voltage $V_{CC}$ can be just slightly greater than the base/emitter voltage of the transistor 66. A relatively small supply voltage can therefore be used to supply the current flowing in the first and second current paths 62, 70, respectively.

The temperature compensated diode voltage generator 60 also includes a third current path 110 formed by a PMOS transistor 114 and another bipolar PNP transistor 116 coupled between $V_{CC}$ and ground. A current $I_3$ flows through the third current path 110. The transistor 114 has the same source voltage and gate voltage as the transistors 64, 74. Furthermore, the drain of the transistor 64 is coupled to ground through the bipolar transistor 66, which is identical to the bipolar transistor 116. As a result, the current $I_3$ is equal to the current $I_1$ and the current $I_2$. A diode forward voltage $V_{EB}$ is developed across the transistor 116.

The temperature compensated diode voltage generator 60 also includes a fourth current path 120 through which a fourth current $I_4$ flows. The fourth current path 120 is formed by a PMOS transistor 124 coupled in series with a resistor 126 between $V_{CC}$ and ground. The current $I_4$ is equal to the currents $I_1$, $I_2$ and $I_3$ for the same reason that the current $I_3$ is equal to the currents $I_1$ and $I_2$, as explained above. As is well known in the art, a thermal voltage $V_T$ is developed across the resistor 126. The resistance of the resistor 126 controls the constant "K" that sets the magnitude of the thermal voltage $KV_T$ so that it is equal to the magnitude of the diode forward voltage $V_{BE}$ at a specific temperature. Of course several resistors can be used in place of the set of the single resistor 126. In an integrated circuit implementation, the use of several resistors rather than the single resistor 126 shown in FIG. 8 would allow the resistance to be varied by varying the number of resistors.

The diode forward voltage $V_{BE}$ and the thermal voltage $KV_T$ are applied to an averaging circuit 130 formed by a first averaging resistor 132 coupled to an output node 134 and receiving the diode forward voltage $V_{EB}$, and a second averaging resistor 138 coupled to the output node 134 and receiving the thermal voltage $KV_T$. A thermally compensated reference voltage $V_R$ is developed at the output node 134, and is filtered by an NMOS transistor 140 connected to the output node 134 to form a capacitor. The resistors 132, 138 form a voltage divider so that the magnitude of the reference voltage $V_R$ is given by the formula: $V_R=(V_{EB}+KV_T)/2$, which is the average of the diode forward voltage $V_{BE}$ and the thermal voltage $KV_T$. It should be noted, however, that the average is obtained without summing the diode forward voltage $V_{BE}$ and the thermal voltage $KV_T$, which would require a voltage substantially larger than either the diode forward voltage $V_{EB}$ or the thermal voltage $KV_T$. As a result, the temperature compensated diode voltage generator 60 can generate a temperature compensated diode forward voltage $V_R$ using a supply voltage $V_{CC}$ having a magnitude that is only slightly greater than the magnitude of the diode forward voltage $V_{BG}$.

It should be noted that one embodiment of a prior art reference voltage generator uses a circuit that is similar to the circuit shown in FIG. 8 except that it connects the resistor 126 to ground through a diode coupled bipolar PNP transistor (not shown), which generates a diode forward voltage. As a result, the prior art circuit inherently sums the diode forward voltage $V_{EB}$ with the thermal voltage $KV_T$, thus requiring a supply voltage $V_{CC}$ having a magnitude that is greater than the magnitude of $V_{BE}+KV_T$.

Figure 9:
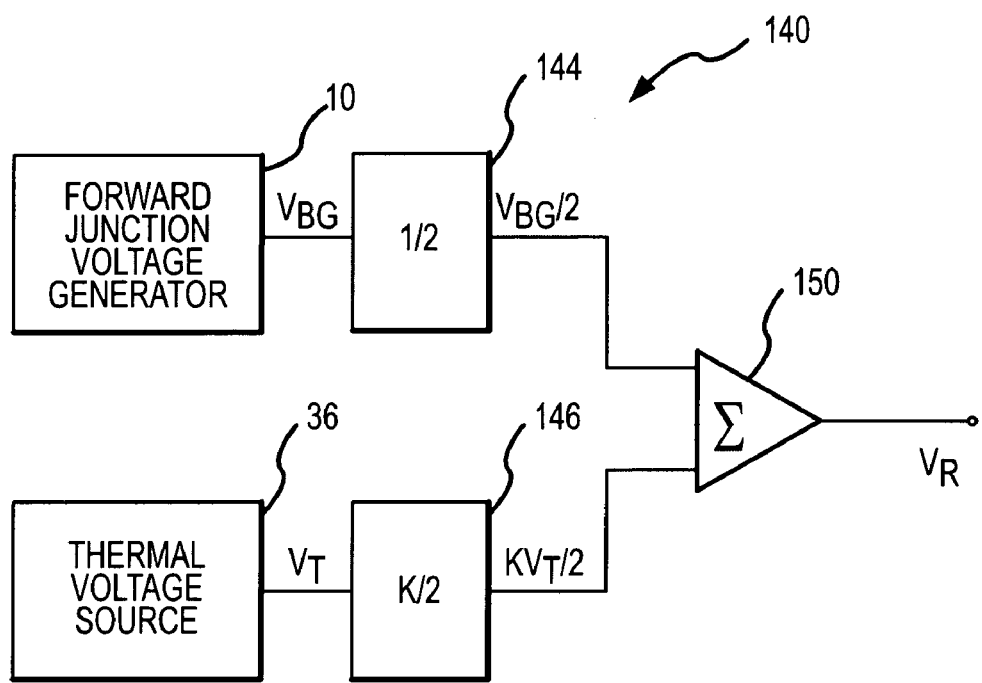
FIG. 9 is a block diagram of a low voltage, temperature compensated diode voltage generator according to another embodiment of the invention.

Another embodiment of a temperature compensated diode voltage generator 140 is shown in FIG. 9. The diode voltage generator 140 also includes the diode voltage generator 10 of FIG. 1 (or some other presently known or hereinafter developed diode voltage generator) as well as the thermal voltage source 36 (which may also be any presently known or hereinafter developed thermal voltage generator). The diode forward voltage $V_{EB}$ generated by the diode voltage generator 10 is scaled by a factor of ½ using a first attenuation circuit 144 to produce a voltage of $V_{BE}/2$. The voltage $V_T$ generated by the thermal voltage source 36 is scaled by a factor of K/2 using an attenuation circuit 146 to produce a thermal reference voltage $KV_T/2$. These two voltages are then applied to a summer 150, which produces a temperature compensated voltage $V_R$ equal to the average of the diode forward voltage $V_{EB}$ and the thermal voltage $KV_T$. Note that the voltage $V_R$ can again be obtained using a supply voltage $V_{CC}$ having a magnitude that is only slightly greater than the magnitude of the diode forward voltage $V_{EB}$ and the magnitude of the thermal voltage $KV_T$.

Figure 10:
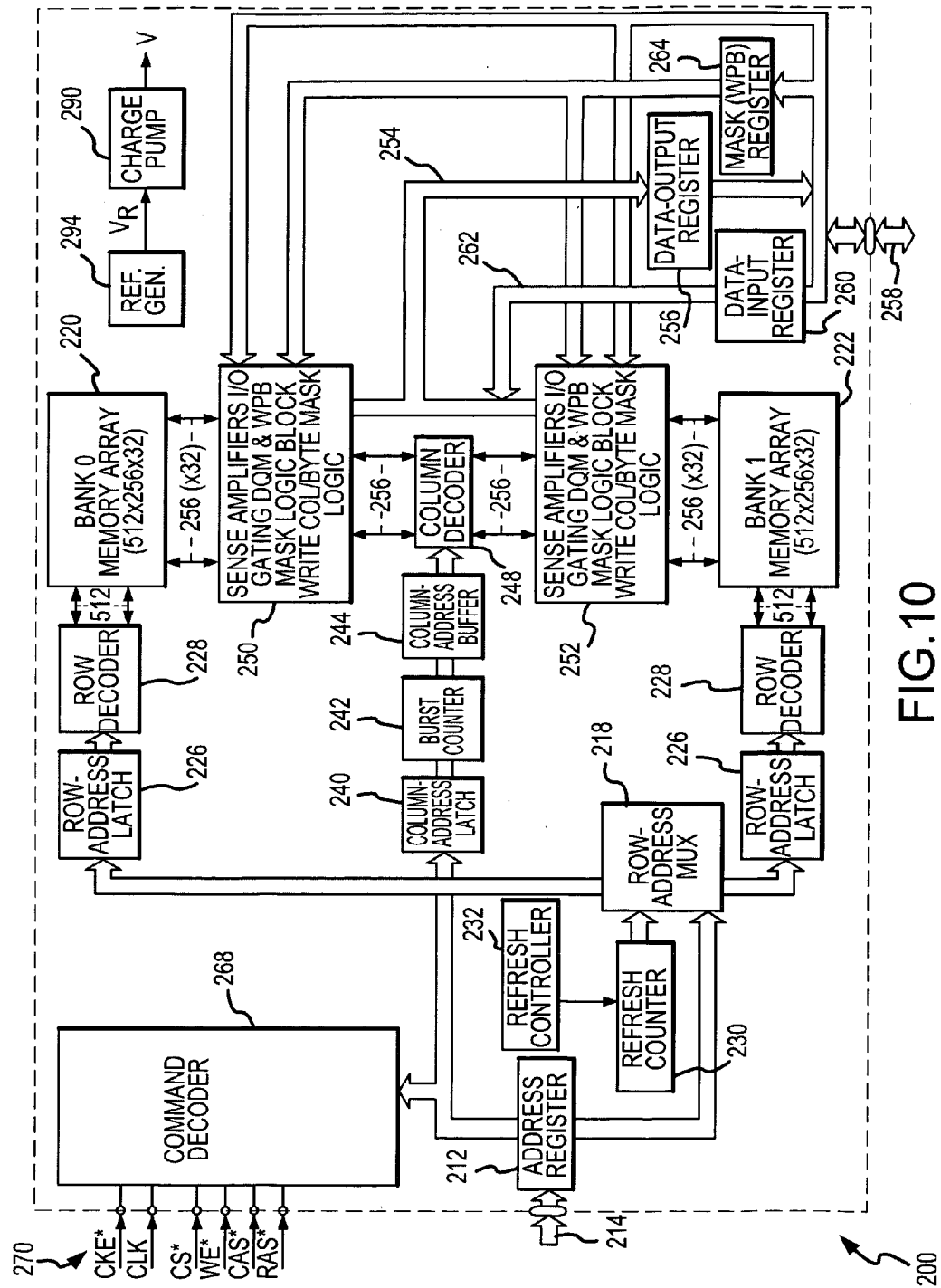
FIG. 10 is a block diagram of a memory device using one or more temperature compensated diode voltage generators according to various embodiments of the present invention.

A temperature compensated diode voltage generator can be advantageously used in a memory device, such a synchronous dynamic random access memory ("SDRAM") 200 shown in FIG. 10, various embodiments of the invention may also be used in other types of memory devices and in electronic circuits other than memory devices. The SDRAM 200 includes an address register 212 that receives either a row address or a column address on an address bus 214. The address bus 214 is generally coupled to a memory controller (not shown). Typically, a row address is initially received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which applies various signals to its respective array 220 or 222 as a function of the stored row address. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248 which applies various signals to respective sense amplifiers and associated column circuitry 250, 252 for the respective arrays 220, 222.

Data to be read from one of the arrays 220, 222 is coupled to the column circuitry 250, 252 for one of the arrays 220, 222, respectively. The data is then coupled through a read data path 254 to a data output register 256, which applies the data to a data bus 258. Data to be written to one of the arrays 220, 222 is coupled from the data bus 258, a data input register 260 and a write data path 262 to the column circuitry 250, 252 where it is transferred to one of the arrays 220, 222, respectively. A mask register 264 may be used to selectively alter the flow of data into and out of the column circuitry 250, 252, such as by selectively masking data to be read from the arrays 220, 222.

The above-described operation of the SDRAM 200 is controlled by a command decoder 268 responsive to command signals received on a command bus 270. These high level command signals, which are typically generated by a memory controller (not shown), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 268 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

The SDRAM 200 further includes a charge pump 290 supplying a voltage to various components in the SDRAM 200. The magnitude of the voltage supplied by the charge pump 290 is controlled by a reference voltage $V_R$ generated by a temperature compensated diode voltage generator 294 in accordance with the present invention. One or more of the temperature compensated diode voltage generators 294 can also be used to supply reference voltages for other purposes, and the temperature compensated diode voltage generator can be used in devices other than memory devices.

Figure 11:
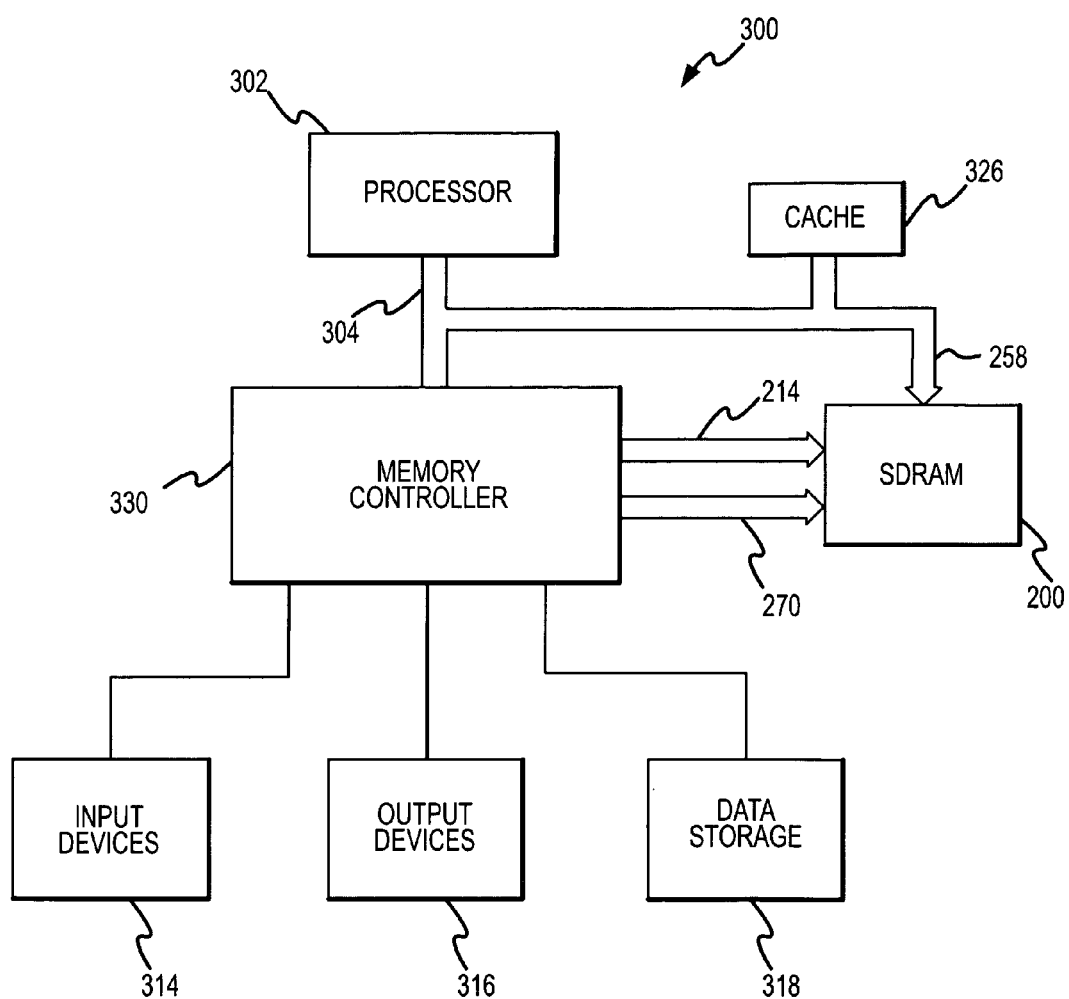
FIG. 11 is a block diagram of a computer system using the memory device of FIG. 10.

A computer system 300 containing the SDRAM 200 of FIG. 11. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes the control bus 270 and the address bus 214 that are coupled to the SDRAM 200. The data bus 258 is coupled from the SDRAM 200 to the processor bus 304 either directly (as shown), through the memory controller 330, or by some other means.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A reference voltage generator comprising:
a diode device generating a forward junction voltage, the magnitude of the generated forward junction voltage having a first predetermined temperature sensitivity;
a thermal voltage generator generating a thermal voltage, the magnitude of the generated thermal voltage having a second predetermined temperature sensitivity; and
a signal combiner coupled to receive the forward junction voltage from the diode device and the thermal voltage from the thermal voltage generator, the signal combiner combining the forward junction voltage with the thermal voltage to provide a reference voltage in a manner that causes the second temperature sensitivity to substantially counteract the first temperature sensitivity so that the reference voltage is substantially insensitive to temperature, the signal combiner being operable to combine the forward junction voltage with the thermal voltage without generating any voltage having a magnitude that is greater than either the forward junction voltage or the thermal voltage.

2. The reference voltage generator of claim 1 wherein the signal combiner comprises an averaging circuit that generates the reference voltage as an average of the forward junction voltage and the thermal voltage.

3. The reference voltage generator of claim 2 wherein the averaging circuit comprises:
a first resistor coupled between an output node and the diode device so that the forward junction voltage is coupled to the output node through the first resistor; and
a second resistor coupled between the output node and the thermal voltage generator so that the thermal voltage is coupled to the output node through the second resistor.

4. The reference voltage generator of claim 3 wherein the resistance of the first resistor is equal to the resistance of the second resistor.

5. The reference voltage generator of claim 1 wherein the diode device comprises:
a bipolar transistor having a emitter, a base and a collector, the bipolar transistor having its base and collector coupled to each other and to a first voltage source; and
a first current source coupled between the emitter of the bipolar transistor and a second voltage source, the first current source causing a first current to flow between the emitter and collector of the bipolar transistor to cause the forward junction voltage to be generated at the emitter of the bipolar transistor.

6. The reference voltage generator of claim 1 wherein the thermal voltage generator comprises:
a resistor having first and second terminals, the first terminal of the resistor being coupled to a first voltage source; and
a first current source coupled between the second terminal of the resistor and a second voltage source, the first current source causing a first current to flow through the resistor to cause the thermal voltage to be generated at the second terminal of the resistor.

7. The reference voltage generator of claim 6 wherein the first voltage source comprises ground potential.

8. The reference voltage generator of claim 6 wherein the diode device comprises:
a bipolar transistor having a emitter, a base and a collector, the bipolar transistor having its base and collector coupled to each other and to a third voltage source; and
a second current source coupled between the emitter of the bipolar transistor and a fourth voltage source, the second current source causing a second current to flow between the emitter and collector of the bipolar transistor to cause the forward junction voltage to be generated at the emitter of the bipolar transistor.

9. The reference voltage generator of claim 8 wherein the magnitude of the first current is substantially equal to the magnitude of the second current.

10. The reference voltage generator of claim 8 wherein the signal combiner comprises:
a first averaging resistor coupled between the emitter of the bipolar transistor and an output node to couple the forward junction voltage to the output node through the first averaging resistor; and
a second averaging resistor coupled between the second terminal of the resistor and the output node to couple the thermal voltage to the output node through the second averaging resistor.

11. A reference voltage generator comprising:
a bipolar transistor having a emitter, a base and a collector, the bipolar transistor having its base and collector coupled to each other and to a first voltage source;
a first current source coupled between the emitter of the bipolar transistor and a second voltage source, the first current source causing a first current to flow between the emitter and collector of the bipolar transistor to cause a forward junction voltage to be generated at the emitter of the bipolar transistor;
a resistor having first and second terminals, the first terminal of the resistor being coupled to a third voltage source;
a second current source coupled between the second terminal of the resistor and a fourth voltage source, the second current source causing a second current to flow through the resistor to cause the thermal voltage to be generated at the second terminal of the resistor;
a first averaging resistor coupled between the emitter of the bipolar transistor and an output node to couple the forward junction voltage to the output node through the first averaging resistor; and
a second averaging resistor coupled between the second terminal of the resistor and the output node to couple the thermal voltage to the output node through the second averaging resistor, a reference voltage being generated at the output node.

12. The reference voltage generator of claim 11 wherein the first and third voltages are equal to each other, and the second and fourth voltages are equal to each other.

13. The reference voltage generator of claim 12 wherein the first and third voltages are ground potential.

14. The reference voltage generator of claim 11 wherein the resistance of the first averaging resistor is equal to the resistance of the second averaging resistor.

15. The reference voltage generator of claim 11, further comprising a regulator circuit coupled to the first and second current paths to regulate the first and second currents so the magnitude of the first current is equal to the magnitude of the second current.

16. The reference voltage generator of claim 15 wherein the regulator circuit comprises:
a first transistor having its source and drain coupled in series in the first current path; and
a second transistor having its source and drain coupled in series in the second current path, the second current transistor being coupled to the first transistor in a current mirror configuration.

17. A supply voltage circuit, comprising:
a charge pump generating a supply voltage having a magnitude determined by a reference voltage applied to a reference voltage input; and
a reference voltage generator having an output node coupled to the reference voltage input of the charge pump, the reference voltage generator, comprising:
a diode device generating a forward junction voltage, the magnitude of the generated forward junction voltage having a first predetermined temperature sensitivity;
a thermal voltage generator generating a thermal voltage, the magnitude of the generated thermal voltage having a second predetermined temperature sensitivity; and
a signal combiner coupled to receive the forward junction voltage from the diode device and the thermal voltage from the thermal voltage generator, the signal combiner combining the forward junction voltage with the thermal voltage to provide a reference voltage at the output node in a manner that causes the second temperature sensitivity to substantially counteract the first temperature sensitivity so that the reference voltage is substantially insensitive to temperature, the signal combiner being operable to combine the forward junction voltage with the thermal voltage without generating any voltage having a magnitude that is substantially greater than either the forward junction voltage or the thermal voltage.

18. The supply voltage circuit of claim 17 wherein the signal combiner comprises an averaging circuit that generates the reference voltage as an average of the forward junction voltage and the thermal voltage.

19. The supply voltage circuit of claim 18 wherein the averaging circuit comprises:
a first resistor coupled between the output node and the diode device so that the forward junction voltage is coupled to the output node through the first resistor; and
a second resistor coupled between the output node and the thermal voltage generator so that the thermal voltage is coupled to the output node through the second resistor.

20. The supply voltage circuit of claim 19 wherein the resistance of the first resistor is equal to the resistance of the second resistor.

21. The supply voltage circuit of claim 17 wherein the diode device comprises:
a bipolar transistor having a emitter, a base and a collector, the bipolar transistor having its base and collector coupled to each other and to a first voltage source; and
a first current source coupled between the emitter of the bipolar transistor and a second voltage source, the first current source causing a first current to flow between the emitter and collector of the bipolar transistor to cause the forward junction voltage to be generated at the emitter of the bipolar transistor.

22. The supply voltage circuit of claim 17 wherein the thermal voltage generator comprises:
a resistor having first and second terminals, the first terminal of the resistor being coupled to a first voltage source; and
a first current source coupled between the second terminal of the resistor and a second voltage source, the first current source causing a first current to flow through the resistor to cause the thermal voltage to be generated at the second terminal of the resistor.

23. The supply voltage circuit of claim 22 wherein the first voltage source comprises ground potential.

24. The supply voltage circuit of claim 22 wherein the diode device comprises:
a bipolar transistor having a emitter, a base and a collector, the bipolar transistor having its base and collector coupled to each other and to a third voltage source; and a second current source coupled between the emitter of the bipolar transistor and a fourth voltage source, the second current source causing a second current to flow between the emitter and collector of the bipolar transistor to cause the forward junction voltage to be generated at the emitter of the bipolar transistor.

25. The supply voltage circuit of claim 24 wherein the magnitude of the first current is substantially equal to the magnitude of the second current.

26. The supply voltage circuit of claim 24 wherein the signal combiner comprises:
   a first averaging resistor coupled between the emitter of the bipolar transistor and the output node to couple the forward junction voltage to the output node through the first averaging resistor; and
   a second averaging resistor coupled between the second terminal of the resistor and the output node to couple the thermal voltage to the output node through the second averaging resistor.

27. A supply voltage circuit, comprising:
   a charge pump generating a supply voltage having a magnitude determined by a reference voltage applied to a reference voltage input; and
   a reference voltage generator having an output node coupled to the reference voltage input of the charge pump, the reference voltage generator, comprising:
      a bipolar transistor having a emitter, a base and a collector, the bipolar transistor having its base and collector coupled to each other and to a first voltage source;
      a first current source coupled between the emitter of the bipolar transistor and a second voltage source, the first current source causing a first current to flow between the emitter and collector of the bipolar transistor to cause a forward junction voltage to be generated at the emitter of the bipolar transistor;
      a resistor having first and second terminals, the first terminal of the resistor being coupled to a third voltage source;
      a second current source coupled between the second terminal of the resistor and a fourth voltage source, the second current source causing a second current to flow through the resistor to cause the thermal voltage to be generated at the second terminal of the resistor;
      a first averaging resistor coupled between the emitter of the bipolar transistor and an output node to couple the forward junction voltage to the output node through the first averaging resistor; and
      a second averaging resistor coupled between the second terminal of the resistor and the output node to couple the thermal voltage to the output node through the second averaging resistor, a reference voltage being generated at the output node.

28. The supply voltage circuit of claim 27 wherein the first and third voltages are equal to each other, and the second and fourth voltages are equal to each other.

29. The supply voltage circuit of claim 28 wherein the first and third voltages are ground potential.

30. The supply voltage circuit of claim 27 wherein the resistance of the first averaging resistor is equal to the resistance of the second averaging resistor.

31. The supply voltage circuit of claim 27, further comprising a regulator circuit coupled to the first and second current paths to regulate the first and second currents so the magnitude of the first current is equal to the magnitude of the second current.

32. The supply voltage circuit of claim 31 wherein the regulator circuit comprises:
   a first transistor having its source and drain coupled in series in the first current path; and
   a second transistor having its source and drain coupled in series in the second current path, the second current transistor being coupled to the first transistor in a current mirror configuration.

33. A memory device, comprising:
   a row address circuit operable to receive and decode row address signals applied to external address terminals of the memory device;
   a column address circuit operable to receive and decode column address signals applied to the external address terminals;
   a memory cell array operable to store data written to or read from the array at a location determined by the decoded row address signals and the decoded column address signals;
   a data path circuit operable to couple data signals corresponding to the data between the array and external data bus terminals;
   a command decoder operable to decode a plurality of command signals applied to respective external command terminals of the memory device, the command decoder being operable to generate control signals corresponding to the decoded command signals;
   a charge pump generating a supply voltage having a magnitude determined by a reference voltage applied to a reference voltage input; and
   a reference voltage generator having an output node coupled to the reference voltage input of the charge pump, the reference voltage generator, comprising:
      a diode device generating a forward junction voltage, the magnitude of the generated forward junction voltage having a first predetermined temperature sensitivity;
      a thermal voltage generator generating a thermal voltage, the magnitude of the generated thermal voltage having a second predetermined temperature sensitivity; and
      a signal combiner coupled to receive the forward junction voltage from the diode device and the thermal voltage from the thermal voltage generator, the signal combiner combining the forward junction voltage with the thermal voltage to provide a reference voltage at the output node in a manner that causes the second temperature sensitivity to substantially counteract the first temperature sensitivity so that the reference voltage is substantially insensitive to temperature, the signal combiner being operable to combine the forward junction voltage with the thermal voltage without generating any voltage having a magnitude that is substantially greater than either the forward junction voltage or the thermal voltage.

34. The memory device of claim 33 wherein the signal combiner comprises an averaging circuit that generates the reference voltage as an average of the forward junction voltage and the thermal voltage.

35. The memory device of claim 34 wherein the averaging circuit comprises:
   a first resistor coupled between the output node and the diode device so that the forward junction voltage is coupled to the output node through the first resistor; and a second resistor coupled between the output node and the thermal voltage generator so that the thermal voltage is coupled to the output node through the second resistor.

36. The memory device of claim 35 wherein the resistance of the first resistor is equal to the resistance of the second resistor.

37. The memory device of claim 33 wherein the diode device comprises:
a bipolar transistor having a emitter, a base and a collector, the bipolar transistor having its base and collector coupled to each other and to a first voltage source; and
a first current source coupled between the emitter of the bipolar transistor and a second voltage source, the first current source causing a first current to flow between the emitter and collector of the bipolar transistor to cause the forward junction voltage to be generated at the emitter of the bipolar transistor.

38. The memory device of claim 33 wherein the thermal voltage generator comprises:
a resistor having first and second terminals, the first terminal of the resistor being coupled to a first voltage source; and
a first current source coupled between the second terminal of the resistor and a second voltage source, the first current source causing a first current to flow through the resistor to cause the thermal voltage to be generated at the second terminal of the resistor.

39. The memory device of claim 38 wherein the first voltage source comprises ground potential.

40. The memory device of claim 38 wherein the diode device comprises:
a bipolar transistor having a emitter, a base and a collector, the bipolar transistor having its base and collector coupled to each other and to a third voltage source; and
a second current source coupled between the emitter of the bipolar transistor and a fourth voltage source, the second current source causing a second current to flow between the emitter and collector of the bipolar transistor to cause the forward junction voltage to be generated at the emitter of the bipolar transistor.

41. The memory device of claim 40 wherein the magnitude of the first current is substantially equal to the magnitude of the second current.

42. The memory device of claim 40 wherein the signal combiner comprises:
a first averaging resistor coupled between the emitter of the bipolar transistor and the output node to couple the forward junction voltage to the output node through the first averaging resistor; and
a second averaging resistor coupled between the second terminal of the resistor and the output node to couple the thermal voltage to the output node through the second averaging resistor.

43. A processor-based system, comprising:
a processor having a processor bus;
an input device coupled to the processor through the processor bus to allow data to be entered into the computer system;
an output device coupled to the processor through the processor bus to allow data to be output from the computer system;
a data storage device coupled to the processor through the processor bus to allow data to be read from a mass storage device;
a memory controller coupled to the processor through the processor bus; and
a memory device coupled to the memory controller, the memory device comprising:
a row address circuit operable to receive and decode row address signals applied to external address terminals of the memory device;
a column address circuit operable to receive and decode column address signals applied to the external address terminals;
a memory cell array operable to store data written to or read from the array at a location determined by the decoded row address signals and the decoded column address signals;
a data path circuit operable to couple data signals corresponding to the data between the array and external data bus terminals;
a command decoder operable to decode a plurality of command signals applied to respective external command terminals of the memory device, the command decoder being operable to generate control signals corresponding to the decoded command signals;
a charge pump generating a supply voltage having a magnitude determined by a reference voltage applied to a reference voltage input; and
a reference voltage generator having an output node coupled to the reference voltage input of the charge pump, the reference voltage generator, comprising:
a diode device generating a forward junction voltage, the magnitude of the generated forward junction voltage having a first predetermined temperature sensitivity;
a thermal voltage generator generating a thermal voltage, the magnitude of the generated thermal voltage having a second predetermined temperature sensitivity; and
a signal combiner coupled to receive the forward junction voltage from the diode device and the thermal voltage from the thermal voltage generator, the signal combiner combining the forward junction voltage with the thermal voltage to provide a reference voltage at the output node in a manner that causes the second temperature sensitivity to substantially counteract the first temperature sensitivity so that the reference voltage is substantially insensitive to temperature, the signal combiner being operable to combine the forward junction voltage with the thermal voltage without generating any voltage having a magnitude that is substantially greater than either the forward junction voltage or the thermal voltage.

44. The processor-based system of claim 43 wherein the signal combiner comprises an averaging circuit that generates the reference voltage as an average of the forward junction voltage and the thermal voltage.

45. The processor-based system of claim 44 wherein the averaging circuit comprises:
a first resistor coupled between the output node and the diode device so that the forward junction voltage is coupled to the output node through the first resistor; and
a second resistor coupled between the output node and the thermal voltage generator so that the thermal voltage is coupled to the output node through the second resistor.

46. The processor-based system of claim 45 wherein the resistance of the first resistor is equal to the resistance of the second resistor.

47. The processor-based system of claim 43 wherein the diode device comprises:

a bipolar transistor having a emitter, a base and a collector, the bipolar transistor having its base and collector coupled to each other and to a first voltage source; and a first current source coupled between the emitter of the bipolar transistor and a second voltage source, the first current source causing a first current to flow between the emitter and collector of the bipolar transistor to cause the forward junction voltage to be generated at the emitter of the bipolar transistor.

48. The processor-based system of claim 43 wherein the thermal voltage generator comprises:

a resistor having first and second terminals, the first terminal of the resistor being coupled to a first voltage source; and a first current source coupled between the second terminal of the resistor and a second voltage source, the first current source causing a first current to flow through the resistor to cause the thermal voltage to be generated at the second terminal of the resistor.

49. The processor-based system of claim 48 wherein the first voltage source comprises ground potential.

50. The processor-based system of claim 48 wherein the diode device comprises:

a bipolar transistor having a emitter, a base and a collector, the bipolar transistor having its base and collector coupled to each other and to a third voltage source; and a second current source coupled between the emitter of the bipolar transistor and a fourth voltage source, the second current source causing a second current to flow between the emitter and collector of the bipolar transistor to cause the forward junction voltage to be generated at the emitter of the bipolar transistor.

51. The processor-based system of claim 50 wherein the magnitude of the first current is substantially equal to the magnitude of the second current.

52. The processor-based system of claim 50 wherein the signal combiner comprises:

a first averaging resistor coupled between the emitter of the bipolar transistor and the output node to couple the forward junction voltage to the output node through the first averaging resistor; and a second averaging resistor coupled between the second terminal of the resistor and the output node to coupled the thermal voltage to the output node through the second averaging resistor.

53. A method of generating a reference voltage, comprising:

generating a forward junction voltage, the magnitude of the generated forward junction voltage having a first predetermined temperature sensitivity;

generating a thermal voltage, the magnitude of the generated thermal voltage having a second predetermined temperature sensitivity;

combining the forward junction voltage with the thermal voltage to provide the reference voltage, the forward junction voltage and the thermal voltage being combined in a manner that causes the second temperature sensitivity to substantially counteract the first temperature sensitivity so that the reference voltage is substantially insensitive to temperature, the forward junction voltage being combined with the thermal voltage in a manner that avoids generating any voltage having a magnitude that is substantially greater than either the forward junction voltage or the thermal voltage.

54. The method of claim 53 wherein the act of combining the forward junction voltage with the thermal voltage comprises averaging the forward junction voltage with the thermal voltage.

55. The method of claim 54 wherein the act of averaging the forward junction voltage with the thermal voltage comprises coupling the forward junction voltage and the thermal voltage to an output node through respective impedance elements.

56. The method of claim 53 wherein the act of generating a forward junction voltage comprises coupling a first current through a bipolar transistor having a emitter, a base and a collector, the bipolar transistor having its base and collector coupled to each other and to a first voltage source and generating the forward junction voltage at the emitter of the bipolar transistor.

57. The method of claim 53 wherein the act of generating a thermal voltage comprises coupling a first current through a resistor, the thermal voltage being generated across the resistor.

* * * * *